United States Patent
Li et al.

(10) Patent No.: US 10,234,880 B1
(45) Date of Patent: Mar. 19, 2019

(54) ACTIVE CLAMP CIRCUIT FOR POWER SEMICONDUCTOR SWITCH AND POWER CONVERTER USING THE SAME

(71) Applicant: Delta Electronics (Shanghai) CO., LTD, Shanghai (CN)

(72) Inventors: Wuying Li, Shanghai (CN); Xin Wang, Shanghai (CN); Lifeng Qiao, Shanghai (CN); Chenyu Lai, Shanghai (CN); Jianping Ying, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

(21) Appl. No.: 16/038,184

(22) Filed: Jul. 18, 2018

(30) Foreign Application Priority Data

Oct. 20, 2017 (CN) .......................... 2017 1 0982947

(51) Int. Cl.
| | |
|---|---|
| *H02M 1/08* | (2006.01) |
| *G05F 1/571* | (2006.01) |
| *H02M 3/158* | (2006.01) |
| *H02M 1/00* | (2006.01) |
| *H02M 3/156* | (2006.01) |

(52) U.S. Cl.
CPC .............. *G05F 1/571* (2013.01); *H02M 1/08* (2013.01); *H02M 3/1582* (2013.01); *H02M 2001/0051* (2013.01); *H02M 2003/1566* (2013.01)

(58) Field of Classification Search
CPC ......... H02M 1/08; H02M 1/571; H02M 3/158
See application file for complete search history.

(56) References Cited

U.S. PATENT DOCUMENTS

| | | | | |
|---|---|---|---|---|
| 2001/0017783 | A1* | 8/2001 | Bruckmann | ....... H03K 17/0828 363/97 |
| 2013/0033909 | A1* | 2/2013 | Jones | ................. H03K 17/0812 363/56.01 |

* cited by examiner

*Primary Examiner* — Timothy J Dole
*Assistant Examiner* — Ishrat Jamali
(74) *Attorney, Agent, or Firm* — Yunling Ren

(57) ABSTRACT

The present disclosure discloses an active clamp circuit for a power semiconductor switch and a power converter using the same. The active clamp circuit includes: a discharging circuit, a first terminal of the discharging circuit being electrically connected to a collector of the power semiconductor switch; an unidirectional blocking circuit; a first voltage regulator diode connected in series with the unidirectional blocking circuit to form a series branch, a first terminal of the series branch being electrically connected to the collector of the power semiconductor switch; and a resistance-capacitance RC circuit, a first terminal of the RC circuit, a second terminal of the discharging circuit, and a second terminal of the serial circuit being electrically connected, a second terminal of the RC circuit being electrically coupled to a gate of the power semiconductor switch.

18 Claims, 7 Drawing Sheets

US 10,234,880 B1

ACTIVE CLAMP CIRCUIT FOR POWER SEMICONDUCTOR SWITCH AND POWER CONVERTER USING THE SAME

CROSS REFERENCE

This application is based upon and claims priority to Chinese Patent Application No. 201710982947.0, filed on Oct. 20, 2017, the entire contents thereof are incorporated herein by reference.

TECHNICAL FIELD

The present disclosure relates to the field of power electronic conversion technology, and in particular, to an active clamp circuit for a power semiconductor switch and a power converter using the same.

BACKGROUND

In a high-voltage and high-power power electronic converter, series connection technology for Insulated Gate Bipolar Transistor (IGBT) is usually used to effectively increase a voltage level so as to meet needs of relatively high voltage applications. Series connected IGBTs may have uneven voltages and high voltage spikes, and it is usually necessary to add an active clamp circuit between the collector and the gate of each IGBT to solve the problem of uneven voltages and high voltage spikes.

At present, in an active clamp circuit for an IGBT, usually a voltage regulator diode connecting in series with other circuits is connected inversely between the collector and the gate of the IGBT, or between the collector and the driver circuit of the gate. When a voltage of the collector exceeds a preset voltage value, the voltage regulator diode breaks down inversely, and charges are injected into the gate or the driver circuit of the gate, such that a voltage Vge of the gate of the IGBT rises, and an impedance between the collector and an emitter decreases. Thus, the charges can be discharged so as to reduce the voltage Vce between the collector and the emitter, and prevent overvoltage of the IGBT. Since the energy of the overvoltage of the IGBT is released by the IGBT itself, the loss of IGBT may be increased.

Therefore, there is a need for a new active clamp circuit for a power semiconductor switch.

The above information disclosed in this Background section is only for enhancement of understanding of the background of the present disclosure and therefore it may contain information that does not form the prior art that is already known to a person of ordinary skill in the art.

SUMMARY

The present disclosure provides an active clamp circuit for a power semiconductor switch and a power converter having the same, to at least overcome one or more problems due to limitations and disadvantages of the related art to a certain degree.

Other features and advantages of the present disclosure will become apparent from the following detailed description, or may be learned by practice of the present disclosure.

According to a first aspect of the present disclosure, an active clamp circuit for a power semiconductor switch is disclosed, including:

a discharging circuit including a first terminal and a second terminal, the first terminal of the discharging circuit being electrically connected to a collector of the power semiconductor switch;

an unidirectional blocking circuit;

a first voltage regulator diode connected in series with the unidirectional blocking circuit to form a series branch, the series branch including a first terminal and a second terminal, the first terminal of the series branch being electrically connected to the collector of the power semiconductor switch; and a resistance-capacitance RC circuit includes a first terminal and a second terminal, the first terminal of the RC circuit, the second terminal of the discharging circuit, and the second terminal of the series branch being electrically connected, and the second terminal of the RC circuit being electrically coupled to a gate of the power semiconductor switch.

According to an exemplary embodiment of the present disclosure, the discharging circuit includes: a first diode, wherein a cathode of the first diode functions as the first terminal of the discharging circuit and an anode of the first diode functions as the second terminal of the discharging circuit.

According to an exemplary embodiment of the present disclosure, the unidirectional blocking circuit includes: a second diode, wherein a cathode of the second diode is connected in series with a cathode of the first voltage regulator diode, an anode of the second diode functions as the first terminal of the series branch, and an anode of the first voltage regulator diode functions as the second terminal of the series branch.

According to an exemplary embodiment of the present disclosure, the unidirectional blocking circuit includes:

a plurality of voltage regulator diodes, the voltage regulator diodes being connected in the same conducting direction in series to form a voltage regulator diode group, wherein a cathode of the voltage regulator diode group functions as the first terminal of the series branch, an anode of the voltage regulator diode group is connected in series with a cathode of the first voltage regulator diode, and an anode of the first voltage regulator diode functions as the second terminal of the series branch.

According to an exemplary embodiment of the present disclosure, a voltage drop of the voltage regulator diode group is higher than a voltage drop of the first diode.

According to an exemplary embodiment of the present disclosure, the unidirectional blocking circuit includes: a second diode, wherein an anode of the second diode is connected in series with an anode of the first voltage regulator diode, a cathode of the first voltage regulator diode functions as the first terminal of the series branch, and a cathode of the second diode functions as the second terminal of the series branch.

According to an exemplary embodiment of the present disclosure, the RC circuit includes a first resistor and a first capacitor, wherein the first resistor is connected in parallel with the first capacitor to form a parallel branch, the parallel branch includes a first terminal and a second terminal, the first terminal of the parallel branch functions as the first terminal of the RC circuit, and the second terminal of the parallel branch functions as the second terminal of the RC circuit.

According to an exemplary embodiment of the present disclosure, the second terminal of the RC circuit is directly and electrically connected to the gate of the power semiconductor switch.

According to an exemplary embodiment of the present disclosure, the second terminal of the RC circuit is electrically connected to the gate of the power semiconductor switch through a power amplification circuit.

According to a second aspect of the present disclosure, a power converter is disclosed, including a plurality of power semiconductor switches connected in series and a plurality of active clamp circuits each being the active clamp circuit described above, a collector and a gate of each of the power semiconductor switches being directly coupled to the corresponding active clamp circuit.

According to some embodiments of the present disclosure, through a simple circuit structure, with only a few elements added, it can avoid the active clamp misoperation caused by the reverse recovery of the voltage regulator diode in the active clamp circuit, and can avoid the loss of the IGBT caused by the active clamp misoperation.

According to some embodiments of the present disclosure, it is possible to make the IGBT immune from a minimum turn-on time and to extend the modulation range. When the IGBTs connected in series are applied to a motor, the motor can be started more smoothly. When the IGBTs connected in series are used in an inverter, the utilization of the bus can be improved.

According to some embodiments of the present disclosure, the serially connected IGBTs can achieve a stable clamping effect and can effectively avoid the uneven voltage problem of the IGBTs due to inconsistent instantaneous gate voltages Vge when the IGBTs are turned off, which is caused by the reverse recovery current of the voltage regulator diode in the active clamp circuit.

According to the embodiments of the present disclosure, through a simple circuit structure, the gate voltage Vge of the IGBT can be effectively controlled with a small loss. It can prevent the active clamp circuit from responding in advance and can also improve the response speed of the active clamp circuit. It can improve the active clamp effect and avoids oscillation of the collector-emitter voltage Vce and the gate voltage Vge when the active clamp circuit responds, reduce the loss of the IGBT and the voltage regulator diode in the active clamp circuit, and greatly increase the reliability of IGBT series connection applications.

It is to be understood that both the foregoing general description and the following detailed description are exemplary only and should not be taken as limiting the present disclosure.

BRIEF DESCRIPTION OF THE DRAWINGS

The above and other objects, features and advantages of the present disclosure will become more apparent through the detailed description of exemplary embodiments thereof with reference to the accompanying drawings.

DETAILED DESCRIPTION

Figure 1:
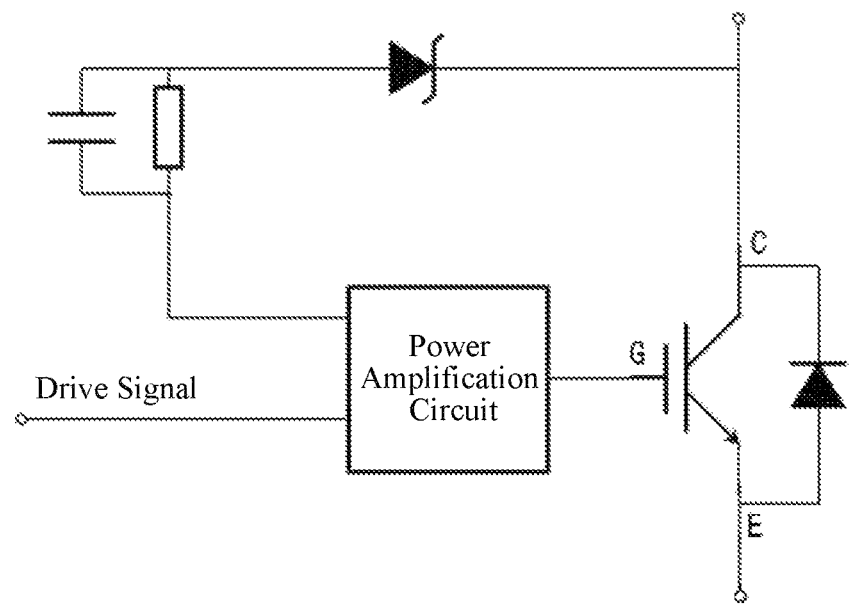
FIG. 1 is a diagram illustrating an active clamp circuit in the related art.

Exemplary embodiments will now be described more fully with reference to the accompanying drawings. However, the exemplary embodiments may be embodied in many forms and should not be construed as limited to the examples set forth herein; rather, these embodiments are provided so that this description will be more thorough and complete, and will fully convey the concept of the exemplary embodiments to those skilled in the art. The drawings are merely schematic representations of the present disclosure and are not necessarily drawn to scale.

Furthermore, the described features, structures, or characteristics may be combined in any suitable manner in one or more embodiments. In the following description, numerous specific details are given to provide a thorough understanding of embodiments of the present disclosure. Those skilled in the art will realize that the technical solutions of the present disclosure may be practiced without one or more of the specific details, or other methods, components, steps, etc. may be utilized. In other instances, well-known structures, methods, implementations, or operations are not shown or described in detail to avoid obscuring respective aspects of the present disclosure.

Some of the block diagrams shown in the accompanying drawings are functional entities and do not necessarily correspond to physically or logically separate entities. These functional entities may be implemented in one or more hardware modules or integrated circuits, or implemented in different networks and/or processor devices and/or microcontroller devices.

An object of the present disclosure is to disclose an active clamp circuit for a power semiconductor switch and a power converter using the same. The active clamp circuit includes: a discharging circuit including a first terminal and a second terminal, the first terminal of the discharging circuit being electrically connected to a collector C of the power semiconductor switch; an unidirectional blocking circuit; a first voltage regulator diode connected in series with the unidirectional blocking circuit to form a series branch, the series branch including a first terminal and a second terminal, the first terminal of the series branch being electrically connected to the collector C of the power semiconductor switch; and a resistance-capacitance RC circuit including a first terminal and a second terminal, the first terminal of the RC circuit, the second terminal of the discharging circuit, and the second terminal of the serial circuit being electrically connected, the second terminal of the RC circuit being electrically coupled to a gate G of the power semiconductor switch. Through a simple circuit structure, with only a few elements added, it can avoid the active clamp malfunction caused by the reverse recovery of the voltage regulator diode in the active clamp circuit, and can avoid the loss of the IGBT caused by the active clamp malfunction because of the reverse recovery of the voltage regulator diode in the existing active clamp circuit. Moreover, it is possible to make the IGBT immune from the minimum on-time and to extend the modulation range. When the IGBTs connected in series are applied to a motor, the motor can be started more smoothly. When the IGBTs connected in series are used in an inverter, the utilization of the bus can be improved. In addition, the serially connected IGBTs can achieve a stable clamping effect and can effectively avoid the uneven voltage problem of the IGBTs due to inconsistent instantaneous gate voltages Vge when the IGBTs are turned off, which is caused by the reverse recovery current of the voltage regulator diode in the active clamp circuit.

Before describing the active clamp circuit for the power semiconductor switch and the power converter having the same of the present disclosure in detail, the active clamp circuit is briefly described at first. As shown in FIG. 1, in some applications, a capacitor or other components are connected in series in the active clamp circuit, in order to achieve the purpose of improving the performance of the active clamping. If in the active clamp circuit, a capacitor is connected in series with the voltage regulator diode, when active clamping occurs, charges injected by the active clamp circuit will be stored in the capacitor. The charges in the capacitor will be released through the voltage regulator diode when the IGBT is turned on. During the process of releasing the charges, the voltage regulator diode is conducted in the forward direction. Since a relatively long time is required for the reverse recovery of the voltage regulator diode, before the reverse recovery is completed, a reverse voltage applied on the voltage regulator diode will generate a relatively large reverse recovery current. When the voltage regulator diode is in the reverse recovery process, turning-off of the IGBT will apply a reverse voltage on the voltage regulator diode, and the reverse recovery current will be injected to the gate G or the driver circuit of the gate such that the gate voltage Vge of the IGBT rises, resulting in a similar effect as the active clamping, while an action threshold is far lower than the present value. This phenomenon is called "active clamp malfunction occurred". The malfunction causes more losses in the IGBT, and in IGBT series applications, it results in an uneven voltage for the IGBT.

Although it is possible to prevent the active clamp circuit from malfunctioning by limiting the modulation range or limiting the minimum turn-on time to ensure that the IGBT is turned off after the reverse recovery of the voltage regulator diode in the active clamp circuit has been completed, this approach sacrifices a modulation ratio, and cannot fundamentally solve the active clamping performance deterioration caused by the reverse recovery current of the voltage regulator diode. Therefore, there is a need for a new active clamp circuit for the power semiconductor switch.

Figure 2:
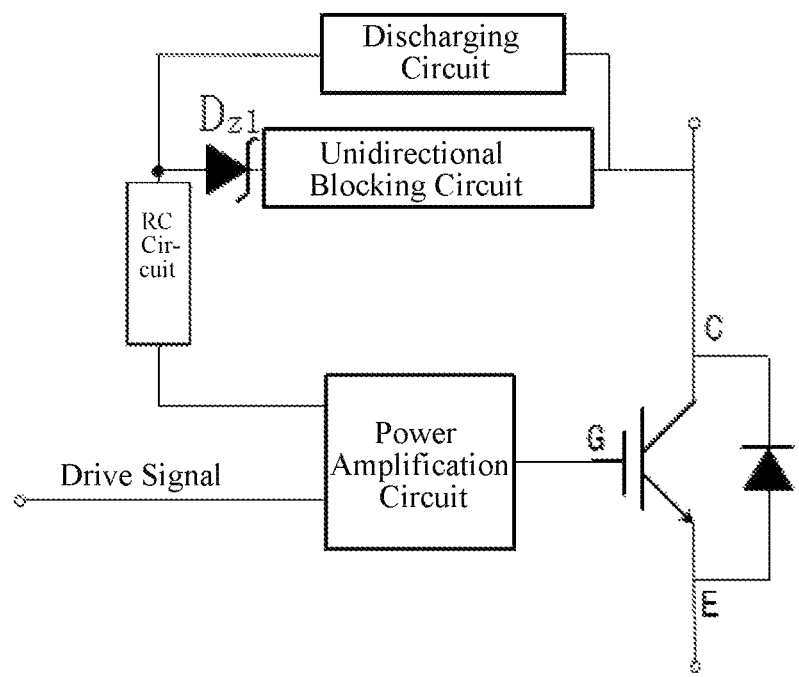
FIG. 2 is a schematic diagram illustrating an active clamp circuit according to an exemplary embodiment of the present disclosure.
Figure 3:
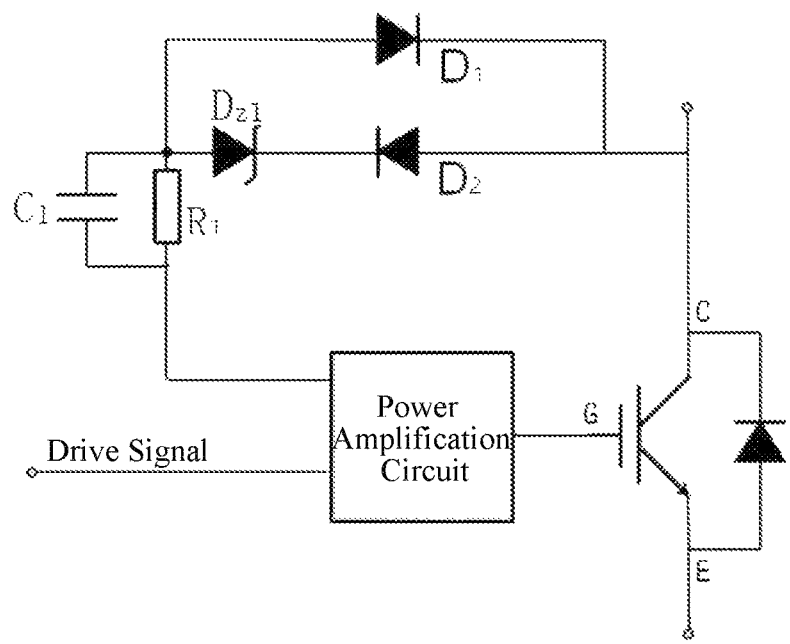
FIG. 3 is a circuit diagram illustrating an active clamp circuit according to an exemplary embodiment of the present disclosure.
Figure 4:
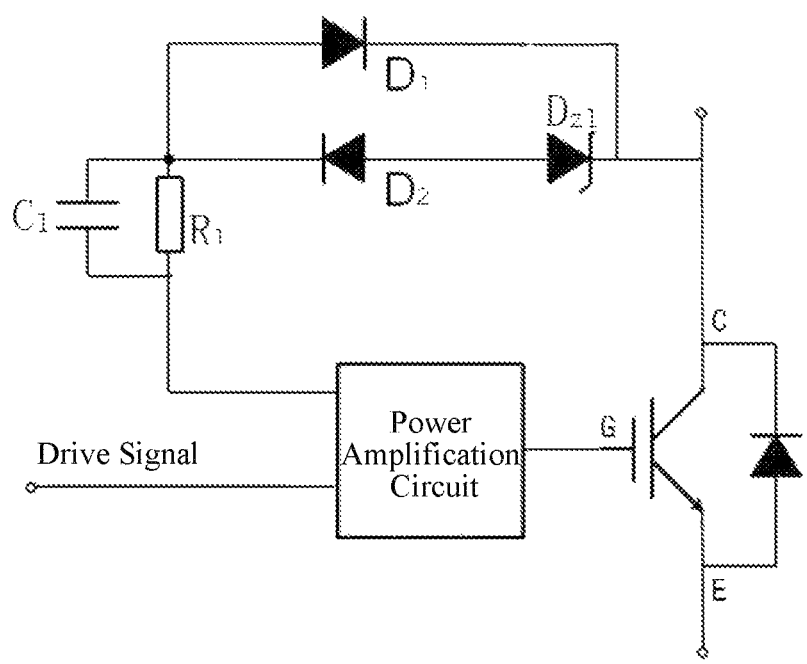
FIG. 4 is a circuit diagram of another variation of the active clamp circuit according to the exemplary embodiment of the present disclosure as shown in FIG. 3.
Figure 5:
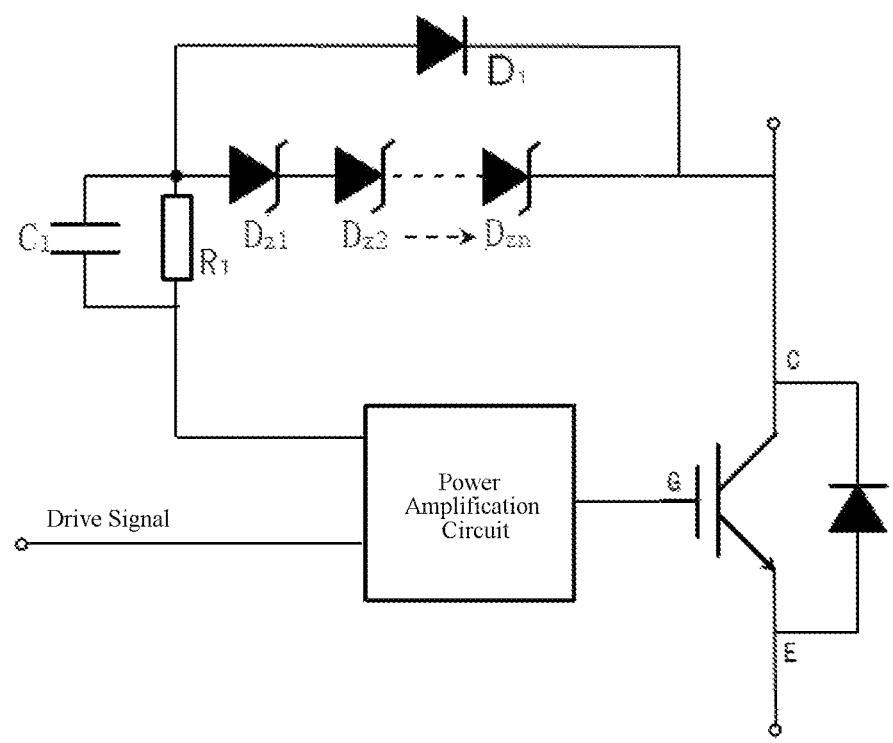
FIG. 5 is a circuit diagram of an active clamp circuit according to another exemplary embodiment of the present disclosure.
Figure 6:
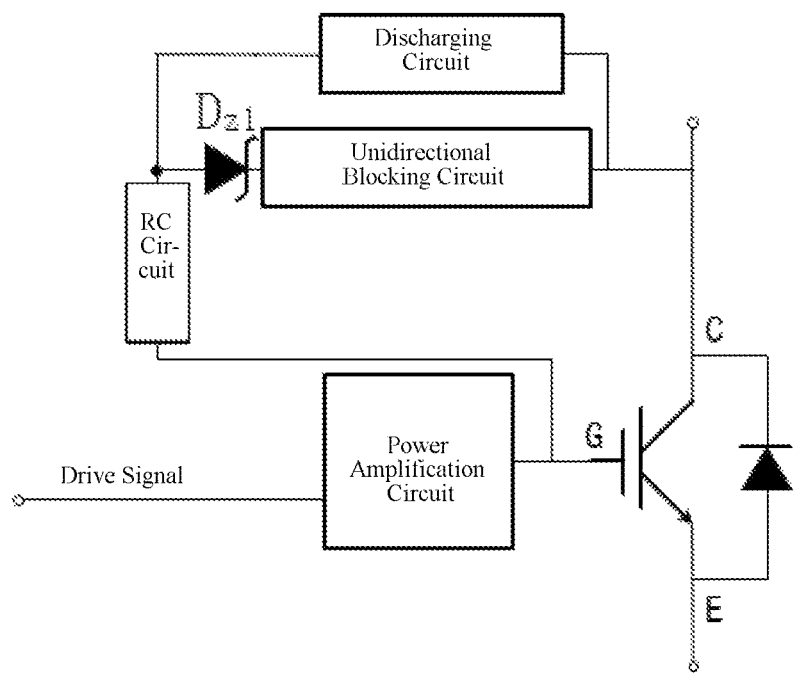
FIG. 6 is a schematic diagram of an active clamp circuit according to still another exemplary embodiment of the present disclosure.
Figure 7:
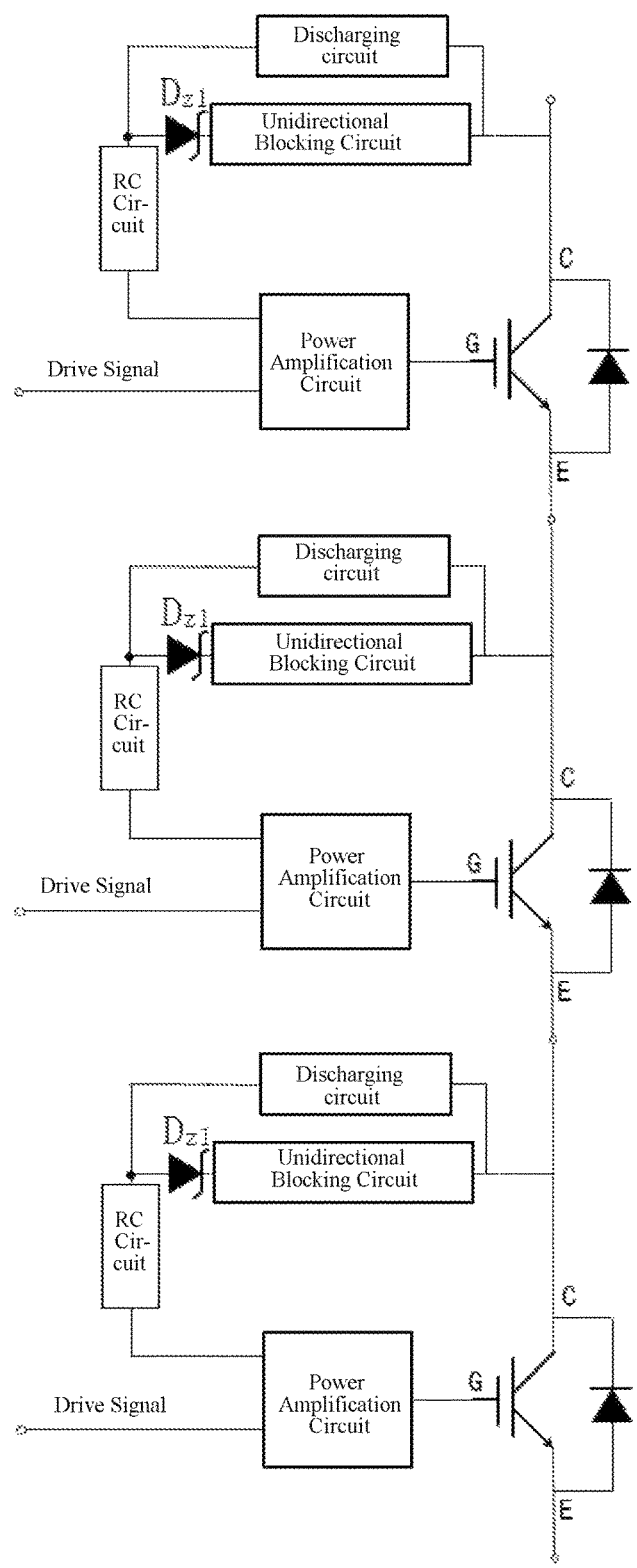
FIG. 7 is a circuit diagram of a power converter according to an exemplary embodiment of the present disclosure.

The active clamp circuit for the power semiconductor switch and the power converter having the same of the present disclosure will be described in detail below with reference to FIGS. 2-7. FIG. 2 is a schematic diagram illustrating an active clamp circuit according to an exemplary embodiment of the present disclosure. FIG. 3 is a circuit diagram illustrating an active clamp circuit according to an exemplary embodiment of the present disclosure. FIG. 4 is a circuit diagram of another variation of the active clamp circuit according to the exemplary embodiment of the present disclosure as shown in FIG. 3. FIG. 5 is a circuit diagram of an active clamp circuit according to another exemplary embodiment of the present disclosure. FIG. 6 is a schematic diagram of an active clamp circuit according to still another exemplary embodiment of the present disclosure. FIG. 7 is a circuit diagram of a power converter according to an exemplary embodiment of the present disclosure.

First, the active clamp circuit for the power semiconductor switch of the present disclosure will be described in detail with reference to FIGS. 2-6. FIG. 2 is a schematic diagram illustrating an active clamp circuit according to an exemplary embodiment of the present disclosure. FIG. 3 is a circuit diagram illustrating an active clamp circuit according to an exemplary embodiment of the present disclosure. FIG. 4 is a circuit diagram of another variation of the active clamp circuit according to the exemplary embodiment of the present disclosure as shown in FIG. 3. FIG. 5 is a circuit diagram of an active clamp circuit according to another exemplary embodiment of the present disclosure. FIG. 6 is a schematic diagram of an active clamp circuit according to still another exemplary embodiment of the present disclosure.

FIG. 2 is a schematic diagram illustrating an active clamp circuit according to an exemplary embodiment of the present disclosure. As shown in FIG. 2, an active clamp circuit for a power semiconductor switch includes: a discharging circuit including a first terminal and a second terminal, the first terminal of the discharging circuit being electrically connected to a collector C of the power semiconductor switch; a unidirectional blocking circuit; a first voltage regulator diode $D_{z1}$ connected in series with the unidirectional blocking circuit to form a series branch, the series branch including a first terminal and a second terminal, the first terminal of the series branch being electrically connected to the collector C of the power semiconductor switch; and a resistance-capacitance (RC) circuit including a first terminal and a second terminal, the first terminal of the RC circuit, the second terminal of the discharging circuit and the second terminal of the series branch being electrically connected, and the second terminal of the RC circuit being electrically coupled to the gate G of the power semiconductor switch.

As shown in FIG. 2, a series branch is formed by connecting a unidirectional blocking circuit in series with the voltage regulator diode $D_{z1}$. The unidirectional blocking circuit may block a current flowing through the voltage regulator diode $D_{z1}$ in a forward direction (conducting direction) and prevent the voltage regulator diode $D_{z1}$ from being conducted in the forward direction, and further, avoid reverse recovery of the voltage regulator diode $D_{z1}$. A discharging circuit is connected in parallel with the series branch formed by the voltage regulator diode $D_{z1}$ and the unidirectional blocking circuit. When the IGBT is turned on, the energy on the capacitor in the resistor-capacitor circuit (i.e. the energy on the clamping capacitor) may be rapidly discharged through the discharging circuit. Thus, it can fundamentally avoid the active clamp malfunction caused by the reverse recovery of the voltage regulator diode $D_{z1}$ in the active clamp circuit. The voltage regulator diode $D_{z1}$ may be a zener diode, but the present disclosure is not limited thereto, and the voltage regulator diode $D_{z1}$ may be other types of voltage regulator diode.

FIG. 3 is a circuit diagram illustrating an active clamp circuit according to an exemplary embodiment of the present disclosure. As shown in FIG. 3, in the active clamp circuit, the discharging circuit includes: a first diode $D_1$. A cathode of the first diode $D_1$ functions as the first terminal of the discharging circuit, and an anode of the first diode $D_1$ functions as the second terminal of the discharging circuit. The unidirectional blocking circuit includes: a second diode $D_2$. A cathode of the second diode $D_2$ and a cathode of the first voltage regulator diode $D_{z1}$ are connected in series, an anode of the second diode $D_2$ functions as the first terminal of the series branch, and an anode of the first voltage regulator diode $D_{z1}$ functions as the second terminal of the series branch. That is to say, the second diode $D_2$ is connected in series in the active clamp circuit of FIG. 1, the direction of which is opposite to the original voltage regulator diode to prevent forward conduction of the voltage regulator diode $D_{z1}$. The first diode $D_1$ having a better reverse recovery characteristic is connected in parallel with the series branch formed by the voltage regulator diode $D_{z1}$ and the second diode $D_2$, and the forward conducting direction of the first diode $D_1$ is the same as the forward conducting direction of the voltage regulator diode $D_{z1}$, so as to provide a discharge path for the capacitor in the RC circuit (i.e. the capacitor in the active clamp circuit). When the IGBT is turned on, the capacitor rapidly discharges through the diode $D_1$. It can fundamentally avoid the active clamp malfunction caused by the reverse recovery of the voltage regulator diode $D_{z1}$ in the active clamp circuit.

It should be noted here that the unidirectional blocking circuit may be connected to a front terminal or a rear terminal of the voltage regulator diode $D_{z1}$. Therefore, the present disclosure does not particularly limit the specific connection positions of the unidirectional blocking circuit and the voltage regulator diode $D_{z1}$. In the exemplary embodiment of FIG. 3, the unidirectional blocking circuit, that is, the second diode $D_2$ is connected to the front terminal of the voltage regulator diode $D_{z1}$. According to another variation of the active clamp circuit according to an exemplary embodiment of the present disclosure as shown in FIG. 4, the unidirectional blocking circuit includes: a second diode $D_2$. An anode of the second diode $D_2$ is connected in series with an anode of the first voltage regulator diode $D_{z1}$, a cathode of the first voltage regulator diode $D_{z1}$ functions as the first terminal of the series branch, a cathode of the second diode $D_2$ functions as the second terminal of the series branch, the unidirectional blocking circuit (that is, the second diode $D_2$) is connected to the rear terminal of the voltage regulator diode $D_{z1}$. This connection position also can avoid the active clamp malfunction caused by the reverse recovery of the voltage regulator diode $D_{z1}$ in the active clamp circuit.

FIG. 5 is a circuit diagram of an active clamp circuit according to another exemplary embodiment of the present disclosure. As shown in FIG. 5, the unidirectional blocking circuit includes: a plurality of voltage regulator diodes $D_{z2}$ ... $D_{zn}$ connected in series in the same conducting direction to form a voltage regulator diode group. A cathode of the voltage regulator diode group serves as the first terminal of the series branch, an anode of the voltage regulator diode group and the cathode of the first voltage regulator diode $D_{z1}$ are connected in series, and the anode of the first voltage regulator diode $D_{z1}$ serves as the second terminal of the series branch. FIG. 5 shows another specific implementation of the active clamp circuit of the present disclosure, in which the voltage regulator diode in FIG. 1 is divided into a plurality of voltage regulator diodes $D_{z1}$, $D_{z2}$ ... $D_{zn}$ in series without changing the total voltage regulator value. The diode $D_1$ with good reverse recovery characteristic is connected in parallel with the series branch, and the forward conducting direction of the diode $D_1$ is the same as the forward conducting direction of the voltage regulator diode $D_{z1}$. It is ensured that the total voltage drop of the voltage regulator diode group is higher than the voltage drop of the diode $D_1$. When the IGBT is turned on, the diode $D_1$ is forwardly conducted to provide a discharge path for the capacitor, and clamp the voltage between the first terminal and the second terminal of the series branch. Since the voltage across the voltage regulator diode group is clamped by the diode $D_1$, and cannot be conducted, it can avoid the reverse recovery of the voltage regulator diode group.

According to an exemplary embodiment of the present disclosure, the RC circuit includes a first resistor $R_1$ and a first capacitor $C_1$. The first resistor is connected in parallel with the first capacitor to form a parallel branch. The parallel branch includes a first terminal and a second terminal. The first terminal of the parallel branch functions as the first terminal of the RC circuit, and the second terminal of the parallel branch functions as the second terminal of the RC circuit.

According to an exemplary embodiment of the present disclosure shown in FIG. 2 to FIG. 5, the second terminal of the RC circuit is electrically connected to the gate G of the power semiconductor switch through a power amplification circuit.

According to an exemplary embodiment of the present disclosure shown in FIG. 6, the second terminal of the RC circuit is directly electrically connected to the gate G of the power semiconductor switch.

Next, a power converter using the active clamp circuit for the power semiconductor switch of the present disclosure will be described with reference to FIG. 7. FIG. 7 is a circuit diagram of a power converter according to an exemplary embodiment of the present disclosure. As shown in FIG. 7, the power converter includes a plurality of power semiconductor switches connected in series and a plurality of active clamp circuits as described above, and the collector C and the gate G of each of the power semiconductor switches are directly coupled to the corresponding active clamp circuit. It should be noted here that the power converter shown in FIG. 7 is exemplified by three power semiconductor switches connected in series, but the present disclosure is not limited thereto, and two or more than three power semiconductors switches may be connected in series. The power converter of this exemplary embodiment can achieve a stable clamping effect when the IGBTs are used in series. When the IGBTs are used in series, it avoid the uneven voltage problem of the IGBTs due to inconsistent instantaneous gate voltages Vge when the IGBTs are turned off, which is caused by the reverse recovery current of the voltage regulator diodes in the active clamp circuits.

In summary, according to the active clamp circuit for a power semiconductor switch and the power converter using the same according to the exemplary embodiments of the present disclosure, through a simple circuit structure, with only a few elements added, it can avoid the active clamp malfunction caused by the reverse recovery of the voltage regulator diode in the active clamp circuit, and can also achieve a stable clamping effect at a relatively small loss. In addition, it can expand the modulation range.

Through the above detailed description, those skilled in the art can easily understand that the active clamp circuit and the power converter using the same according to the exemplary embodiments of the present disclosure have one or more of the following advantages.

According to some embodiments of the present disclosure, through a simple circuit structure, with only a few elements added, it can avoid the active clamp malfunction caused by the reverse recovery of the voltage regulator diode in the active clamp circuit, and can avoid the loss of the IGBT generated in active clamp malfunction caused by the reverse recovery of the voltage regulator diode in the active clamp circuit.

According to some embodiments of the present disclosure, it is possible to make the IGBT immune from the minimum on-time and to extend the modulation range.

When IGBTs connected in series are applied to a motor, the motor can be started more smoothly. When IGBTs connected in series are used in an inverter, it can improve the utilization of the bus.

According to some embodiments of the present disclosure, the serially connected IGBTs can achieve a stable clamping effect and can effectively avoid the uneven voltage problem of the IGBTs due to inconsistent instantaneous gate voltages Vge when the IGBTs are turned off, which is caused by the reverse recovery current of the voltage regulator diode in the active clamp circuit.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. An active clamp circuit for a power semiconductor switch, comprising:
   a discharging circuit comprising a first terminal and a second terminal, the first terminal of the discharging circuit being electrically connected to a collector of the power semiconductor switch;
   an unidirectional blocking circuit;
   a first voltage regulator diode connected in series with the unidirectional blocking circuit to form a series branch, the series branch comprising a first terminal and a second terminal, and the first terminal of the series branch being electrically connected to the collector of the power semiconductor switch; and
   a resistance-capacitance RC circuit comprising a first terminal and a second terminal, the first terminal of the RC circuit, the second terminal of the discharging circuit, and the second terminal of the series branch being electrically connected, and the second terminal of the RC circuit being electrically coupled to a gate of the power semiconductor switch.

2. The active clamp circuit according to claim 1, wherein the discharging circuit comprises: a first diode,
   wherein a cathode of the first diode functions as the first terminal of the discharging circuit and an anode of the first diode functions as the second terminal of the discharging circuit.

3. The active clamp circuit according to claim 2, wherein the unidirectional blocking circuit comprises: a second diode,
   wherein a cathode of the second diode is connected in series with a cathode of the first voltage regulator diode, an anode of the second diode functions as the first terminal of the series branch, and an anode of the first voltage regulator diode functions as the second terminal of the series branch.

4. The active clamp circuit according to claim 2, wherein the unidirectional blocking circuit comprises: a plurality of voltage regulator diodes, the voltage regulator diodes being connected in the same conducting direction in series to form a voltage regulator diode group,
   wherein a cathode of the voltage regulator diode group functions as the first terminal of the series branch, an anode of the voltage regulator diode group is connected in series with a cathode of the first voltage regulator diode, and an anode of the first voltage regulator diode functions as the second terminal of the series branch.

5. The active clamp circuit according to claim 4, wherein a voltage drop of the voltage regulator diode group is higher than a voltage drop of the first diode.

6. The active clamp circuit according to claim 2, wherein the unidirectional blocking circuit comprises: a second diode,
   wherein an anode of the second diode is connected in series with an anode of the first voltage regulator diode, a cathode of the first voltage regulator diode functions as the first terminal of the series branch, and a cathode of the second diode functions as the second terminal of the series branch.

7. The active clamp circuit according to claim 1, wherein the RC circuit comprises a first resistor and a first capacitor,
   wherein the first resistor is connected in parallel with the first capacitor to form a parallel branch, the parallel branch comprises a first terminal and a second terminal, the first terminal of the parallel branch functions as the first terminal of the RC circuit, and the second terminal of the parallel branch functions as the second terminal of the RC circuit.

8. The active clamp circuit according to claim 1, wherein the second terminal of the RC circuit is directly and electrically connected to the gate of the power semiconductor switch.

9. The active clamp circuit according to claim 1, wherein the second terminal of the RC circuit is electrically connected to the gate of the power semiconductor switch through a power amplification circuit.

10. A power converter, comprising a plurality of power semiconductor switches connected in series and a plurality of active clamp circuits each being the active clamp circuit according to claim 1, wherein a collector and a gate of each of the power semiconductor switches are directly coupled to the corresponding active clamp circuit.

11. The power converter according to claim 10, wherein the discharging circuit comprises: a first diode,
   wherein a cathode of the first diode functions as the first terminal of the discharging circuit and an anode of the first diode functions as the second terminal of the discharging circuit.

12. The power converter according to claim 11, wherein the unidirectional blocking circuit comprises: a second diode,
   wherein a cathode of the second diode is connected in series with a cathode of the first voltage regulator diode, an anode of the second diode functions as the first terminal of the series branch, and an anode of the first voltage regulator diode functions as the second terminal of the series branch.

13. The power converter according to claim 11, wherein the unidirectional blocking circuit comprises: a plurality of voltage regulator diodes, the voltage regulator diodes being connected in the same conducting direction in series to form a voltage regulator diode group,
   wherein a cathode of the voltage regulator diode group functions as the first terminal of the series branch, an anode of the voltage regulator diode group is connected in series with a cathode of the first voltage regulator diode, and an anode of the first voltage regulator diode functions as the second terminal of the series branch.

14. The power converter according to claim 13, wherein a voltage drop of the voltage regulator diode group is higher than a voltage drop of the first diode.

15. The power converter according to claim 11, wherein the unidirectional blocking circuit comprises: a second diode,
- wherein an anode of the second diode is connected in series with an anode of the first voltage regulator diode, a cathode of the first voltage regulator diode functions as the first terminal of the series branch, and a cathode of the second diode functions as the second terminal of the series branch.

16. The power converter according to claim 10, wherein the RC circuit comprises a first resistor and a first capacitor,
- wherein the first resistor is connected in parallel with the first capacitor to form a parallel branch, the parallel branch comprises a first terminal and a second terminal, the first terminal of the parallel branch functions as the first terminal of the RC circuit, and the second terminal of the parallel branch functions as the second terminal of the RC circuit.

17. The power converter according to claim 10, wherein the second terminal of the RC circuit is directly and electrically connected to the gate of the power semiconductor switch.

18. The power converter according to claim 10, wherein the second terminal of the RC circuit is electrically connected to the gate of the power semiconductor switch through a power amplification circuit.

* * * * *